United States Patent [19]
Dennison et al.

[11] Patent Number: 5,913,127
[45] Date of Patent: *Jun. 15, 1999

[54] METHOD TO THERMALLY FORM HEMISPHERICAL GRAIN (HSG) SILICON TO ENHANCE CAPACITANCE FOR APPLICATION IN HIGH DENSITY DRAMS

[75] Inventors: Charles H. Dennison, Meridian; Randhir P. S. Thakur, Boise, both of Id.

[73] Assignee: Micron Technology, Inc., Boise, Id.

[*] Notice: This patent is subject to a terminal disclaimer.

[21] Appl. No.: 08/842,302

[22] Filed: Apr. 23, 1997

Related U.S. Application Data

[63] Continuation of application No. 08/496,722, Jun. 29, 1995, Pat. No. 5,663,090.

[51] Int. Cl.⁶ .................. H01L 21/20; H01L 21/8242
[52] U.S. Cl. .................. 438/398; 438/255; 438/964
[58] Field of Search ............................. 438/255, 398, 438/964; 257/309

[56] References Cited

U.S. PATENT DOCUMENTS

| | | | |
|---|---|---|---|
| 4,906,590 | 3/1990 | Kanetaki et al. | 437/249 |
| 5,037,773 | 8/1991 | Lee et al. | 437/977 |
| 5,278,091 | 1/1994 | Fazan et al. | 437/52 |
| 5,290,729 | 3/1994 | Hayashide et al. | 437/977 |
| 5,302,540 | 4/1994 | Ko et al. | 437/233 |
| 5,340,765 | 8/1994 | Dennison et al. | 437/52 |
| 5,366,917 | 11/1994 | Watanabe et al. | 437/60 |
| 5,407,534 | 4/1995 | Thakur | 437/60 |
| 5,444,013 | 8/1995 | Akram et al. | 437/60 |
| 5,500,388 | 3/1996 | Niino et al. | 437/248 |
| 5,518,948 | 5/1996 | Walker | 437/60 |
| 5,663,090 | 9/1997 | Dennison et al. | 438/398 |

*Primary Examiner*—Peter Toby Brown
*Assistant Examiner*—Toniae M. Thomas

[57] ABSTRACT

An embodiment of the present discloses a thermal process for forming hemispherical grained silicon on a silicon material by the steps of: heating the silicon material to a steady state temperature; exposing the silicon material to a hydrogen containing ambient; and causing a decreasing temperature differential of the silicon material while exposing the silicon material to a silicon hydride gas. This embodiment is accomplished by using a thermal cycle having a temperature ramp up period, a temperature steady state period during at least a portion of which the $H_2$ ambient is present and temperature ramp down period during at least a portion of which the diluted silicon hydride gas is present. A second embodiment discloses a process for forming a hemispherical grained silicon surface on at least one capacitor plate made of silicon material, by increasing the temperature of the capacitor plate in an $H_2$ containing ambient; exposing a surface of the capacitor plate's silicon material to a cleaning gas (such as $GeH_4$, $NF_3$, using ultraviolet light in the presence of ozone gas, vapor hydrofluoric acid silicon hydride gas, and $H_2$); and decreasing the temperature of the capacitor plate while exposing the capacitor plate to a silicon hydride gas.

5 Claims, 4 Drawing Sheets

METHOD TO THERMALLY FORM HEMISPHERICAL GRAIN (HSG) SILICON TO ENHANCE CAPACITANCE FOR APPLICATION IN HIGH DENSITY DRAMS

This a continuation to U.S. patent application Ser. No. 08/496,722, filed Jun. 29, 1995 now U.S. Pat. No. 5,663,090.

FIELD OF THE INVENTION

This invention relates to semiconductor fabrication processing and more particularly to a process for forming HemiSpherical Grain (HSG) silicon.

BACKGROUND OF THE INVENTION

The continuing trend of scaling down integrated circuits has forced the semiconductor industry to consider new techniques for fabricating precise components at submicron levels. Along with the need for smaller components, there has been a growing demand for devices requiring less power consumption. In the manufacture of transistors, these trends have led the industry to refine approaches to achieve thinner cell dielectric and gate oxide layers.

In dynamic semiconductor memory storage devices it is essential that storage node capacitor cell plates be large enough to retain an adequate charge (or capacitance) in spite of parasitic capacitance and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer.

Though stacked (capacitor) storage cells are promising candidates to achieve sufficient storage capacitance in a limited area, as the DRAM cell size shrinks scaling of the stacked capacitor structures is becoming more difficult.

Conventionally, it is known that the storage capacitance can be enhanced by using HemiSpherical Grain (HSG) silicon to form the storage node electrode without increasing the area required for the cell or the storage electrode height. The available methods include the direct deposition of HSG polysilicon by Low Pressure Chemical Vapor Deposition (LPCVD) with the temperature optimized between amorphous silicon and polysilicon deposition temperatures, and HSG formation by subsequent high vacuum annealing.

U.S. Pat. No. 5,278,091 and U.S. Pat. No. 5,278,091, having a common assignee, having related subject matter, are hereby incorporated by reference.

SUMMARY OF THE INVENTION

An embodiment of the present invention teaches a process for forming hemispherical grained silicon on a silicon material by:

heating the silicon material in an $H_2$ ambient;
presenting a cleaning gas to the silicon material; and
decreasing the temperature of the silicon material while exposing the silicon material to a silicon hydride gas.

DETAILED DESCRIPTION OF THE INVENTION

Figure 1:
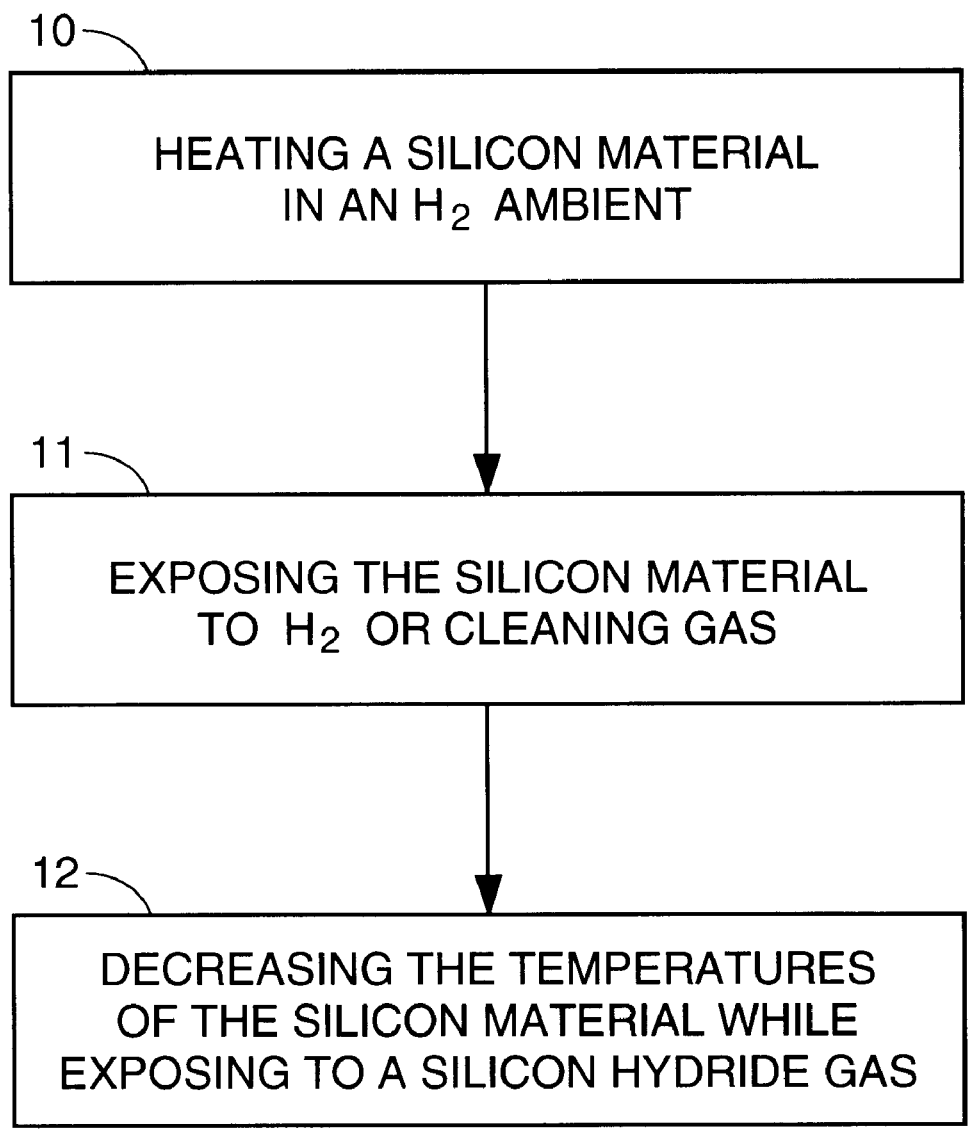
FIG. 1 is a process flow diagram of an embodiment of the present invention forming hemispherical grain (HSG) silicon.
Figure 2:
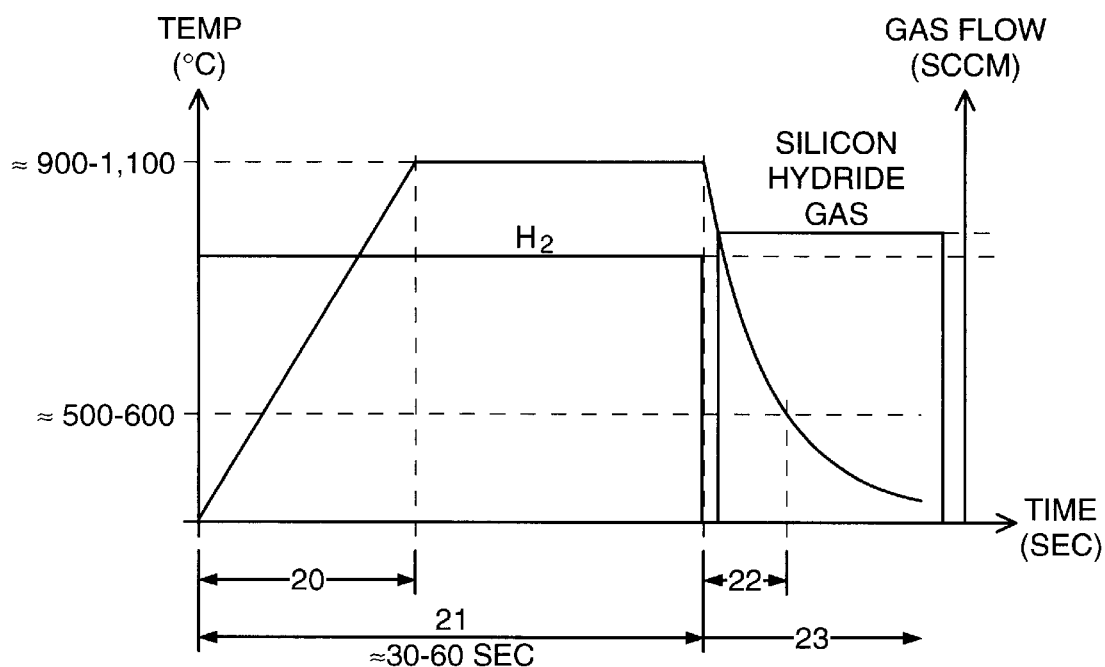
FIG. 2 shows formation of HSG silicon during a temperature cycle.

An embodiment of the present invention is directed to a process for forming hemispherical grain (HSG) silicon as depicted by the process steps of FIG. 1. FIG. 2 shows formation of HSG silicon during a temperature cycle. FIGS. 3a, 3b and 4a, 4b depict the formation of HSG silicon on a silicon material.

Referring now to FIG. 1, a process for forming hemispherical grained silicon on a silicon material is depicted. At step 10, a silicon material is heated in the presence of an $H_2$ ambient; at step 11, the silicon material is continues to be exposed to $H_2$ ambient gas or the material is exposed to a cleaning gas; and at step 12, the temperature of the silicon material is decreased while the silicon material is exposed to a silicon hydride gas.

In accordance with the graph depicted in FIG. 2, it is preferred that the process steps be performed in the order that is outlined in FIG. 1. A silicon material, such as polysilicon, or amorphous silicon hemispherical grained silicon, preferably conductively doped with conductive impurities (either introduced in situ during formation of the silicon material or introduced into the silicon material by implantation after the silicon material is formed) is subjected to a thermal cycle having a temperature ramp up period 20, a temperature steady state period (with temperature ranging from approximately 500° C. to 1100° C.) and temperature ramp down period 22 during at least a portion of which the diluted silicon hydride gas is present. The $H_2$ ambient may be present during the entire ramp up period 20, as well as during the entire steady state period 21. However, it is preferred the $H_2$ ambient at least be present for a period of time during the steady state period 21. Also, though the silicon hydride gas may be present during the entire ramp down period 22 (or longer as shown by period 23), the silicon hydride gas must be present for at least a portion of the ramp down time period 22. Also, if so desired, the $H_2$ ambient and the silicon hydride gas may overlap during any of the three cycles. It is preferred this thermal cycle is performed by rapid thermal processing or the thermal cycle is performed by a furnace that has a very fast heat ramp rate, such as furnaces having a ramp rate of 6° C./min to as high as 40° C./min.

In one embodiment of the present invention, the silicon hydride gas is diluted with an inert gas, such as Ar and $N_2$. In a preferred embodiment, the diluted silicon hydride gas is silane ($SiH_4$) which is diluted with approximately 2% argon. Other silicon hydride gases, such as disilane ($Si_2H_6$) may be substituted for silane.

It may also prove advantageous to preclean the silicon material prior to the heating of the silicon material by subjecting the silicon material to a silicon surface cleaning gas, such as $GeH_4$, $NF_3$, vapor hydrofluoric acid or by using ultraviolet light in an ozone gas, during a temperature ranging from 25° C. to 1250° C.

Figure 3A:
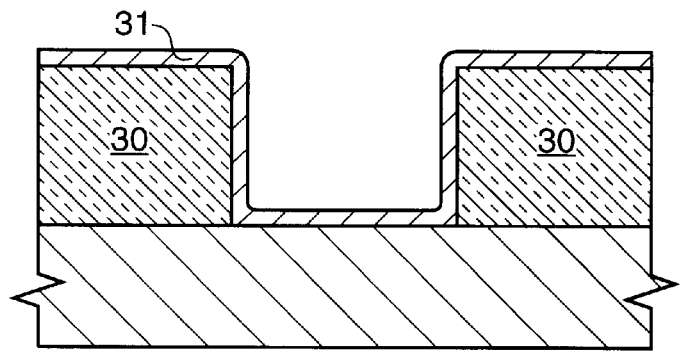
FIGS. 3a, 3b, 3c and 4a, 4b are cross-sectional views of an in-process wafer portion depicting the formation of HSG silicon on a silicon material.
Figure 3B:
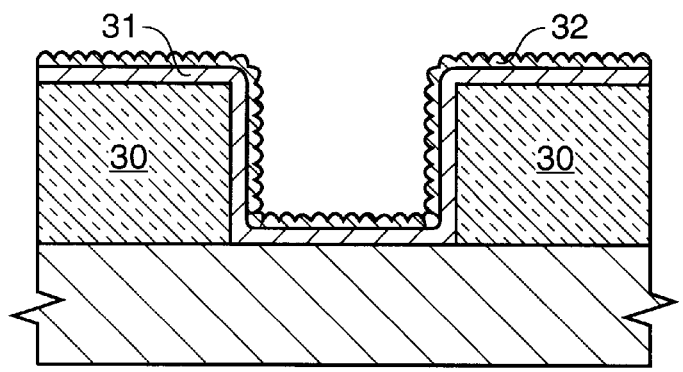
Figure 3C:
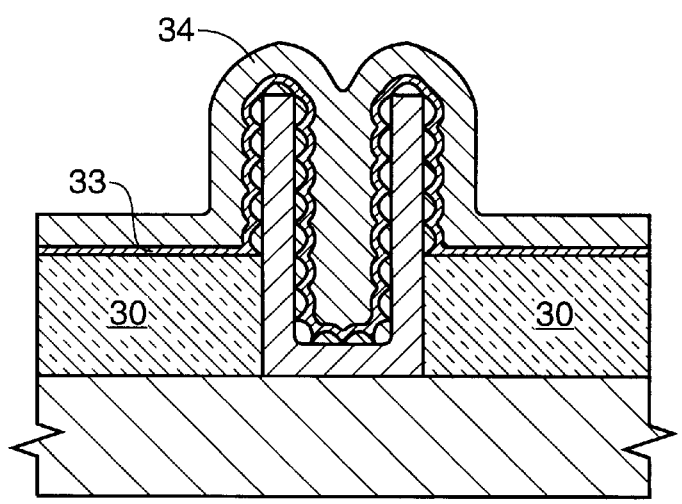

FIGS. 3a, and 3b depict the resulting formation a hemispherical grained silicon surface such as on a capacitor plate (i.e., a storage cell capacitor plate). Referring now to FIG. 3a, a silicon layer 31 has been formed over supporting substrate 30. Referring now to FIG. 3b, the structure of FIG. 3a is subjected to the process steps as depicted in FIG. 1 and the formation of HSG silicon 32 is the result. Silicon layers 31 and 32 may be used to form a storage node to a storage cell. FIG. 3c depicts a completed storage capacitor where an alternate Reactive Ion Etch (RIE) is performed on the structure of FIG. 3a and thus exposes the outside walls of silicon layer 31. After performing the RIE, remaining silicon layer 31 is subjected to the process steps depicted in FIG. 1 to form a storage node cell plate made of HSG silicon 32. To complete the storage capacitor a dielectric layer 33 is formed on HSG silicon 32, followed by the formation of a second capacitor cell plate made of conductive layer 34.

Figure 4A:
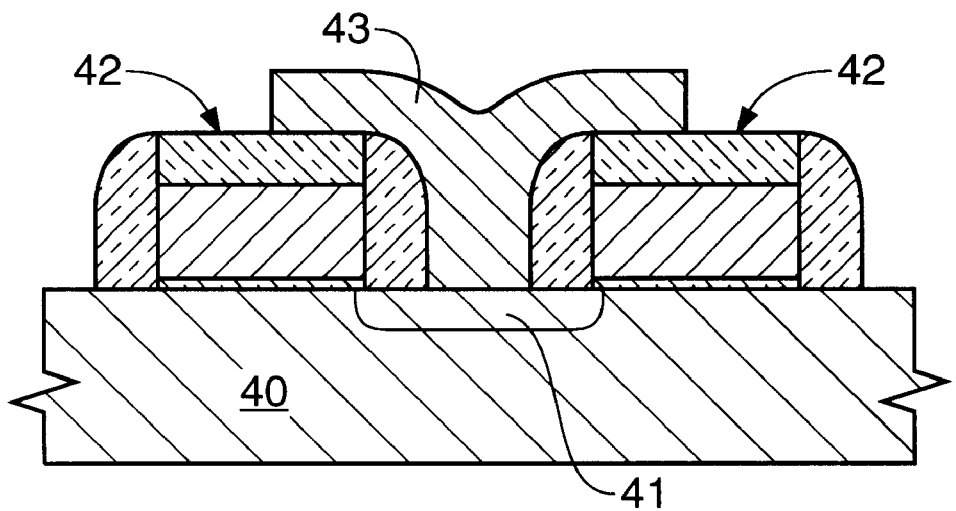
Figure 4B:
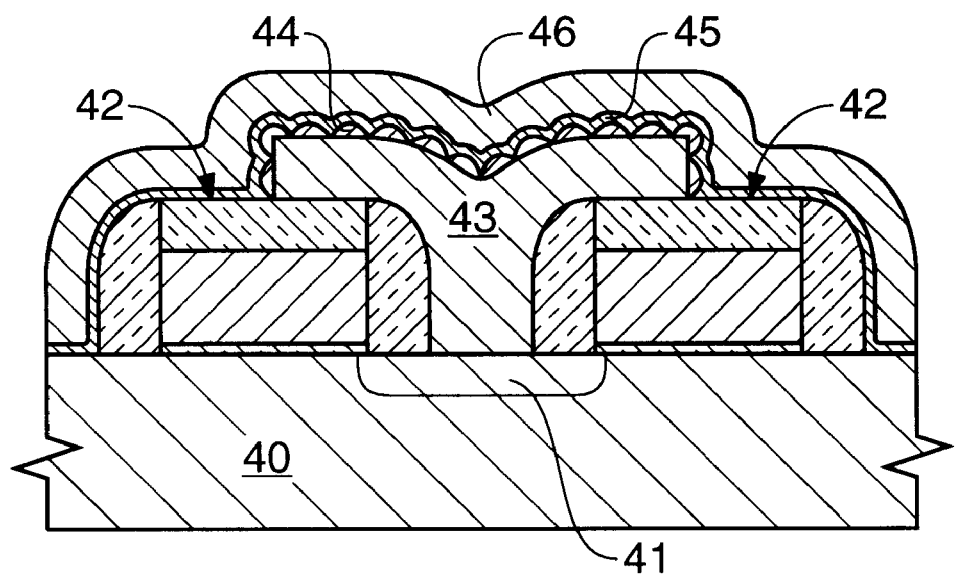

FIGS. 4a and 4b depict the resulting formation a hemispherical grained silicon surface such as on a silicon plug. Referring now to FIG. 4a, a silicon plug 43 has been formed over a supporting substrate 40, interposed between patterned lines 42 and connecting to diffusion region 41. A Reactive Ion Etch (RIE) is used to form the patterned silicon plug 43 having exposed outer sidewalls. After performing the RIE, remaining silicon plug 43 is subjected to the process steps depicted in FIG. 1 to form a storage node cell plate made of HSG silicon 44. To complete the storage capacitor a dielectric layer 45 is formed on HSG silicon 44, followed by the formation of a second capacitor cell plate made of conductive layer 46.

FIGS. 3a, 3b, 3c and 4a, 4b represent steps that may integrated into semiconductor wafer fabrication and in particular DRAM fabrication to form storage capacitors. Conventional steps know to those skilled in the art may be used to fabricate the wafer up to the construction of the structures of FIGS. 3a and 4a. In like manner, after the formation of the HSG silicon, as depicted in 3b, 3c and 4b, the wafer is completed using conventional fabrication process steps.

It is to be understood that although the present invention has been described with reference to a preferred embodiment, various modifications, known to those skilled in the art, may be made to the structures and process steps presented herein without departing from the invention as recited in the several claims appended hereto.

What is claimed is:

1. A thermal process for forming hemispherical grained silicon on a silicon material comprising the steps of:

heating said silicon material to a steady state temperature;

exposing said silicon material to a hydrogen containing ambient; and decreasing the temperature of said silicon material while exposing said silicon material to a silicon hydride gas.

2. The process as recited in claim 1, wherein said process further comprises a thermal cycle having a temperature ramp up period, a temperature steady state period during at least a portion of which said $H_2$ ambient is present and a temperature ramp down period during at least a portion of which said diluted silicon hydride gas is present.

3. The process of claim 1, wherein said silicon material is increased in temperature from a lower temperature to said steady state temperature.

4. The process as recited in claim 1, wherein said thermal process is a rapid thermal processing.

5. The process as recited in claim 1, wherein said thermal process comprises the use at least one furnace having a temperature ramp rate in the range of 6° C./min to 40° C./min.

* * * * *